United States Patent [19]

Doepker

[11] Patent Number: 4,737,745

[45] Date of Patent: Apr. 12, 1988

[54] ELECTROMAGNETIC INTERFERENCE FILTER ASSEMBLY

[75] Inventor: Roy J. Doepker, Lima, Ohio

[73] Assignee: Westinghouse Electric Corp., Pittsburgh, Pa.

[21] Appl. No.: 926,282

[22] Filed: Nov. 3, 1986

[51] Int. Cl.$^4$ .............................................. H03H 7/00
[52] U.S. Cl. .................................. 333/183; 333/185; 361/328
[58] Field of Search ............... 333/181, 182, 183, 185; 361/302, 328; 339/143 R, 147 R; 439/607, 620

[56] References Cited

U.S. PATENT DOCUMENTS

| | | | |
|---|---|---|---|
| 3,035,237 | 5/1962 | Schlicke | 361/302 X |
| 3,106,671 | 10/1963 | Coleman et al. | 361/302 |
| 3,462,715 | 8/1969 | Schor | 333/183 |
| 4,464,702 | 8/1984 | Miller et al. | 361/328 |

FOREIGN PATENT DOCUMENTS 0855343  11/1960  United Kingdom ................ 361/302

Primary Examiner—Eugene R. LaRoche
Assistant Examiner—Seung Ham
Attorney, Agent, or Firm—R. P. Lenart

[57] ABSTRACT

An electromagnetic interference filter assembly includes a pair of magnetic cores each having a central opening. The cores are mounted with their openings aligned along a common axis and feedthrough conductors pass through the openings. Two arrays of capacitors are mounted on opposite sides of the cores and capacitor bus bars serve to electrically connect corresponding ones of these capacitors in each array. A portion of each capacitor bus bar includes an aperture which is aligned along the common axis and through bolts which lie along the common axis are used to hold the feedthrough conductors and capacitor bus bars in electrical contact with each other.

9 Claims, 4 Drawing Sheets

4,737,745

ELECTROMAGNETIC INTERFERENCE FILTER ASSEMBLY

BACKGROUND OF THE INVENTION

This invention relates to electromagnetic interference (EMI) noise suppression filters, and more particularly, to the structural assembly of such filters.

One type of electrical power system used in aircraft includes a generator which is driven at a variable speed and is connected through rectifiers to a pair of DC link conductors. These conductors feed an inverter which synthesizes a 400 Hz sine wave by switching a plurality of transistor switches in accordance with an appropriate switching pattern. This type of power system is commonly called a variable speed constant frequency (VSCF) power system. An electromagnetic interference filter is required on the output of the inverter to eliminate high frequency noise caused by switching transients.

One type of EMI filter which has been used on VSCF power systems includes a plurality of generally cylindrical capacitors arranged in a generally rectangular array. Several ferrite inductive cores are mounted on one side of the array and feedthrough bus bars passed through these inductors. Capacitor bus bars are connected to terminals at one end of each capacitor and are typically brazed to the feedthrough conductors. Terminals extending from the other ends of the capacitors are shorted by a shorting plate. Although such filter assemblies perform their intended function, it is still desirable to provide an EMI filter assembly which is smaller in size, easier to assemble, and requires a smaller number of components.

SUMMARY OF THE INVENTION

Electromagnetic interference filters constructed in accordance with the present invention include two magnetic cores each having an opening extending therethrough. These cores are mounted with their openings aligned along a common axis and feedthrough conductors extend through the openings. A plurality of capacitors are mounted in two arrays positioned on opposite sides of the magnetic cores. Capacitor bus bars extending from corresponding capacitors in each array have portions which lie adjacent to each other and include apertures which are positioned along the common axis. A through bolt or other means for holding the feedthrough conductors and capacitor bus bars in compression is provided to maintain electrical contact between the feedthrough conductors and capacitor bus bars.

DESCRIPTION OF THE PREFERRED EMBODIMENT

Figure 1:
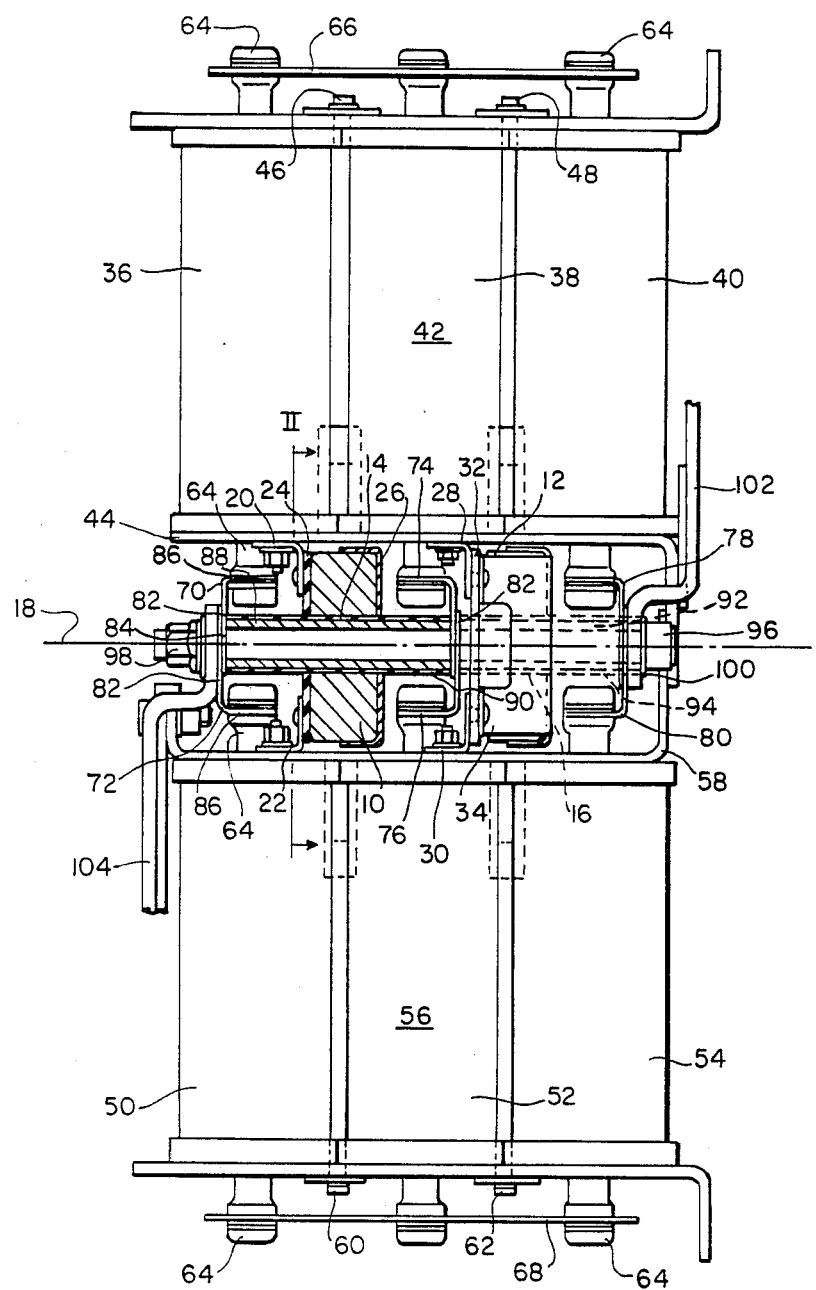
FIG. 1 is a side view, partially in cross-section, of an electromagnetic interference filter assembly constructed in accordance with the present invention.

Referring to the drawings, FIG. 1 is a side view of an electromagnetic interference filter assembly constructed in accordance with one embodiment of the present invention. This assembly includes a pair of magnetic cores 10 and 12, which may be of a high frequency ferrite composition. Each of these cores includes a central opening 14 and 16. The openings are aligned along a common axis 18. The first core 10 is held in position by a pair of core mounting brackets 20 and 22 which are riveted to a non-magnetic insulating plate 24 and a can 26 which surrounds the core. Similarly, core 12 is held in position by core mounting brackets 28 and 30 which are riveted to insulating plate 32 and can 34. A first plurality of capacitors 36, 38 and 40 is assembled into a first generally rectangular capacitor array 42 with each of the capacitors being attached to a capacitor mounting bracket 44. The capacitors are held in place by bolts 46 and 48. A second plurality of capacitors 50, 52 and 54 are arranged in a generally rectangular array 56 by being attached to capacitor mounting bracket 58 and held in place by bolts 60 and 62. Each of the capacitors is generally cylindrical in shape and includes a terminal 64 extending from each end. The outer terminals of the capacitors of array 42 are electrically shorted by a shorting plate 66. Similarly, the outer terminals of the capacitors of array 56 are shorted by shorting plate 68. The inner terminals of the capacitors are each connected to a capacitor bus bar 70, 72, 74, 76, 78 and 80. These capacitor bus bars each include a first portion 82 having an aperture 84 which is aligned along the common axis 18. A second portion 86 of each capacitor bus bar is electrically connected to one of the inner terminals 64 of one of the capacitors. Capacitor bus bars which are connected to corresponding capacitors in arrays 42 and 56, for example capacitor bus bars 70 and 72, include first portions 82 which lie adjacent to each other. A first feedthrough conductor 88 in the form of a conductive tube passes through the opening in core 10 and extends between capacitor bus bars 70 and 74. Insulation 90 serves to electrically insulate feedthrough conductor 88 from core 10. A second feedthrough conductor 92, also in the form of a conductive tube, passes through the opening in core 12 and is insulated from core 12 by insulation 94. The second feedthrough conductor extends between capacitor bus bars 76 and 78. A feedthrough bolt 96 passes through the feedthrough conductors and the associated capacitor bus bars and is secured by nut 98. This feedthrough bolt serves as means for holding the feedthrough conductors and associated capacitor bus bars in compression thereby providing good electrical contact between these components. A spring washer 100 is placed on the feedthrough bolt 96 to provide additional compressive force. Bus bars 102 and 104 serve as means for connecting the feedthrough conductors and associated capacitor bus bars to an external circuit. Each of these bus bars includes an opening which is aligned along the common axis 18 and receives the bolt 96.

Figure 2:
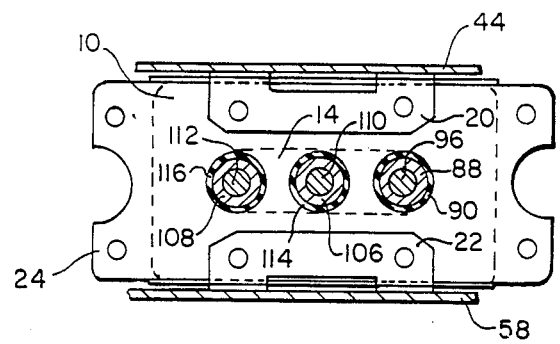
FIG. 2 is a cross-section of a portion of the assembly of FIG. 1 taken along line II—II.

FIG. 2 is a cross-section of a portion of the EMI filter assembly of FIG. 1 taken along line II—II. This view shows that the opening 14 in core 10 is oblong and actually receives three tubular conductors 88, 106 and 108 and three through bolts 96, 110 and 112. Insulation 114 and 116 serves to insulate feedthrough conductors 106 and 108, respectively, from core 10. It should be understood that the central opening in core 12 is also oblong and receives additional feedthrough conductors which are aligned with the feedthrough inductors illustrated in FIG. 2.

Figure 3:
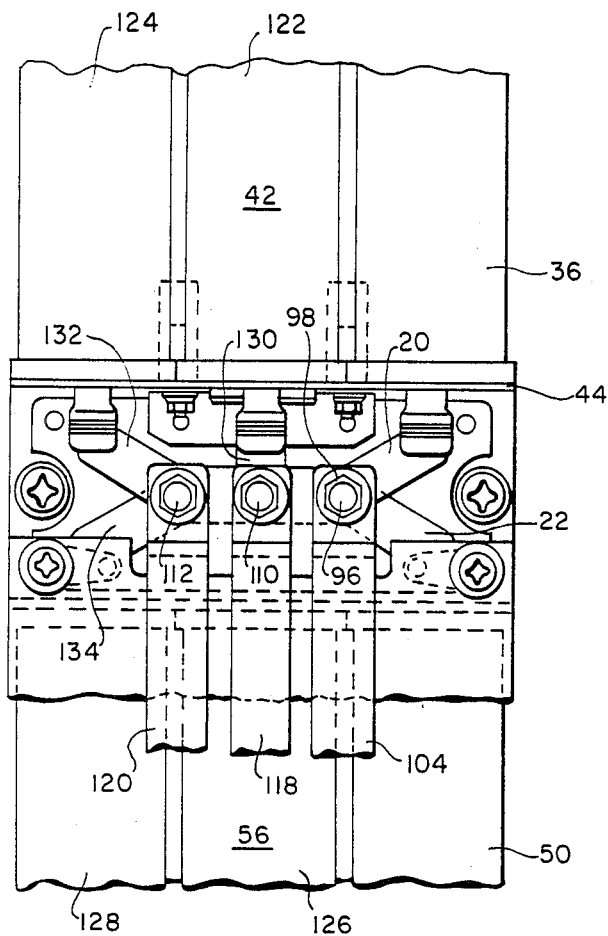
FIG. 3 is a second side view of the assembly of FIG. 1.

FIG. 3 is a second side view of the EMI filter assembly of FIG. 1. This view illustrates that additional bus bars 118 and 120 are connected to the feedthrough conductors and capacitor bus bars associated with through bolts 110 and 112. It should be noted that capacitor array includes three rows of capacitors as illustrated by capacitors 36, 122 and 124 while capacitor array 56 includes three rows of capacitors as illustrated by capcitors 50, 126 and 128. Capacitor bus bar 130 is electrically connected to terminal 64 of capacitor 122 as well as to the feedthrough conductor around bolt 110 and an additional capacitor bus bar, not shown, which is connected to the inner terminal of capacitor 126. Similarly, the inner terminals of capacitors 124 and 128 are electrically connected to each other through bus bars 132 and 134.

Figure 4:
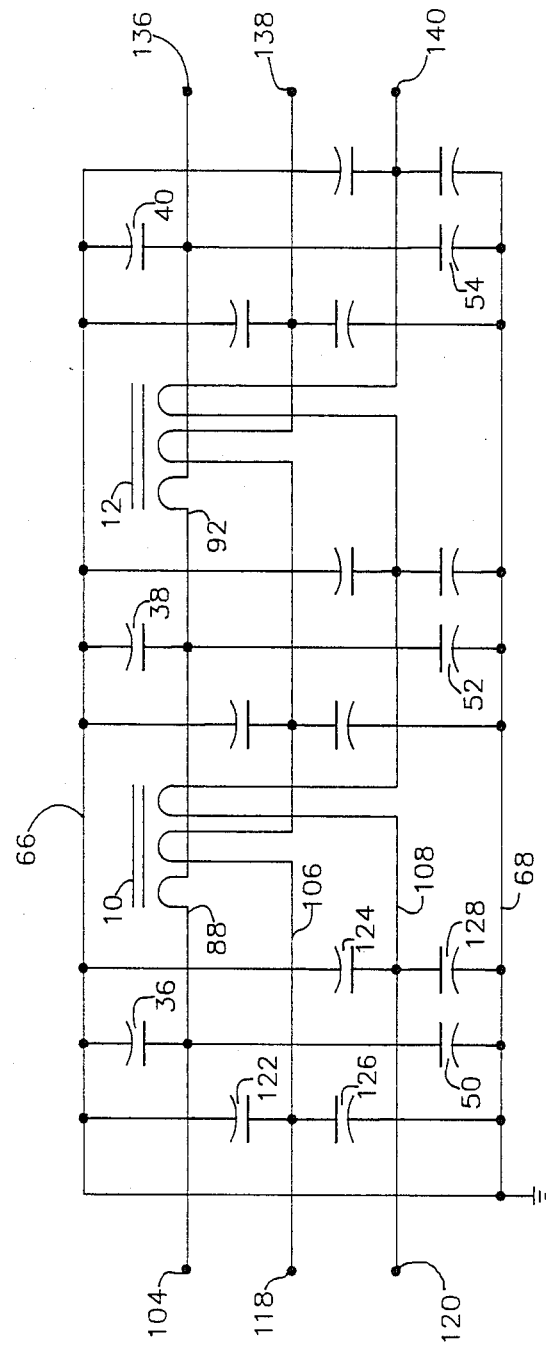
FIG. 4 is a schematic diagram representative of the circuit formed by the components of the assembly of FIG. 1.

FIG. 4 is a schematic diagram of the circuit formed by the components of the EMI filter assembly of FIGS. 1, 2 and 3. Note that additional means for connecting the feedthrough conductors to an external circuit 136, 138 and 140 are positioned at opposite ends of the bus bar connections 104, 118 and 120. It should be apparent from FIG. 4 that the preferred embodiment of this invention is designed for use on a three-phase, three-wire circuit and includes only two inductive cores 10 and 12.

Figure 5:
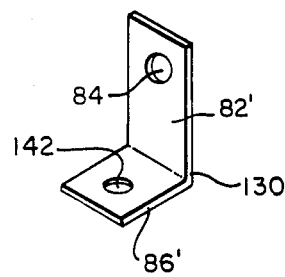
FIGS. 5 and 6 are isometric views of two of the capacitor bus bars used in the assembly of FIG. 1.
Figure 6:
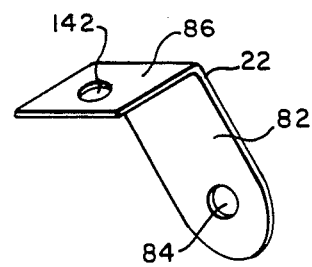

FIGS. 5 and 6 are isometric views of two capacitor bus bars used in the assembly of FIG. 1. Note that each of these capacitor bus bars includes a first portion 82 or 82' having an opening 84 for receiving a through bolt and a second portion 86 or 86' having an opening 142 for receiving a capacitor terminal.

By arranging the capacitors in a pair of generally rectangular arrays which are positioned on opposite sides of a pair of magnetic cores which have openings that are aligned along a common axis, the assembly of the present invention provides a compact structure. The use of through bolts to provide the necessary electrical connections between feedthrough conductors and capacitor bus bars eliminates the need for brazed electrical connections. It should be apparent that although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. An electromagnetic interference filter assembly comprising:
   a first magnetic core having a first opening extending therethrough;
   a second magnetic core having a second opening extending therethrough;
   means for mounting said first and second magnetic cores with said first and second openings being aligned along a common axis;
   a first feedthrough conductor extending through said first opening;
   a second feedthrough conductor extending through said second opening;
   a plurality of capacitors;
   means for mounting said capacitors in first and second capacitor arrays on opposite sides of said common axis;
   a first capacitor bus bar, electriclly connected to one of said capacitors in said first capacitor array, said first capacitor bus bar including a first portion extending between said first and second feedthrough conductors and defining a first aperture positioned along said common axis;
   a second capacitor bus bar, electrically connected to one of said capacitors in said second capacitor array, said second capacitor bus bar including a first portion extending between said first and second feedthrough conductors and defining a second aperture positioned along said common axis, said first portions of said first and second capacitor bus bars lying adjacent to each other;
   means for holding said first and second feedthrough conductors and said first and second capacitor bus bars in electrical contact with each other; and
   means for electrically connecting said first and second feedthrough conductors to an external circuit.

2. A filter assembly as recited in claim 1, wherein:
   said first feedthrough conductor is a first conductive tube;
   said second feedthrough conductor is a second conductive tube; and
   said means for holding comprises a bolt extending through said first and second conductive tubes.

3. A filter assembly as recited in claim 2, wherein said means for holding further comprises:
   a spring encircling said bolt.

4. A filter assembly as recited in claim 1, further comprising:
   a third capacitor bus bar, electrically connected to one of said capacitors in said first capacitor array, said third capacitor bus bar including a first portion extending adjacent to one end of said first feedthrough conductor and defining a third aperture positioned along said common axis;
   a fourth capacitor bus bar, electrically connected to one of said capacitors in said second capacitor array, said fourth capacitor bus bar including a first portion lying adjacent to said first portion of said third capacitor bus bar and defining a fourth aperture positioned along said common axis; and
   wherein said means for holding also holds said third and fourth capacitor bus bars in electrical contact with each other.

5. A filter assembly as recited in claim 1, further comprising:
   a third feedthrough conductor extending through said first opening;
   a fourth feedthrough conductor extending through said second opening;
   a third capacitor bus bar, electrically connected to one of said capacitors in said first capacitor array, said third capacitor bus bar including a first portion extending between said third and fourth feedthrough conductors and defining a third aperture positioned along said common axis;
   a fourth capacitor bus bar, electrically connected to one of said capacitors in said second capacitor array, said fourth capacitor bus bar including a first portion extending between said third and fourth feedthrough conductors and defining a fourth aperture positioned along said common axis, said first portions of said third and fourth capacitor bus bars lying adjacent to each other;

means for holding said third and fourth feedthrough conductors and said third and fourth capacitor bus bars in electrical contact with each other; and means for electrically connecting said third and fourth feedthrough conductors to an external circuit.

6. A filter assembly as recited in claim 1, further comprising:

means for electrically insulating said first feedthrough conductor from said first magnetic core; and means for electrically insulating said second feedthrough conductor from said second magnetic core.

7. A filter assembly as recited in claim 1, wherein:

each of said capacitors includes an inner end, an outer end, an inner terminal extending from said inner end, and an outer terminal extending from said outer end;

wherein the outer terminals of each of said capacitors in said first array pass through are are electrically connected to a first bus plate; and wherein the outer terminals of each of said capacitors in said second array pass through and are electrically connected to a second bus plate.

8. A filter assembly as recited in claim 1, wherein:

said means for electrically connecting said first feedthrough conductor to an external circuit includes a first but conductor having a first hole adjacent to one end and said holding means holds said first feedthrough conductor and said first bus conductor in contact with each other; and said means for electrically connecting said second feedthrough conductor to an external circuit includes a second bus conductor having a second hole adjacent to one end and said holding means holds said second feedthrough conductor and said second bus conductor in contact with each other.

9. An electromagnetic interference filter assembly comprising:

a first magnetic core having a first opening extending therethrough;

a second magnetic core having a second opening extending therethrough;

means for mounting said first and second magnetic cores with said first and second openings being aligned along a common axis;

a plurality of capacitors;

means for mounting nine of said capacitors in a first array;

means for mounting nine of said capacitors in a second array, each of said nine capacitors in said first array corresponding to one of the capacitors in said second array;

a plurality of capacitor bus bars each having a first portion defining an opening and a second portion electrically connected to one of said capacitors;

said capacitor bus bars being arranged in pairs with the first portions of said capacitor bus bars, which are connected to corresponding ones of said capacitors, lying adjacent to each other;

a first set of three feedthrough conductors extending through said first opening;

a second set of three feedthrough conductors extending through said second opening;

one of each of said capacitor bus bar pairs lying adjacent to one end of each of said feedthrough conductors in said first set;

one of each of said capacitor bus bar pairs lying adjacent to one end of each of said feedthrough conductors in said second set;

one of each of said capacitor bus bar pairs lying between one of said feedthrough conductors in said first set and one of said feedthrough conductors in said second set;

three bolts for hlding selected ones of said feedthrough conductors and selected ones of said capacitor bus bar pairs in electrical contact with each other; and means for electrically connecting each of said feedthrough conductors to an external circuit.

* * * * *